United States Patent
Widmann et al.

[19]

[11] Patent Number: 6,124,156
[45] Date of Patent: Sep. 26, 2000

[54] PROCESS FOR MANUFACTURING A CMOS CIRCUIT WITH ALL-AROUND DIELECTRICALLY INSULATED SOURCE-DRAIN REGIONS

[75] Inventors: Dietrich Widmann, Unterhaching; Martin Kerber, München, both of Germany

[73] Assignee: Infineon Technologies AG, Munich, Germany

[21] Appl. No.: 09/027,015

[22] Filed: Feb. 20, 1998

[30] Foreign Application Priority Data

Feb. 20, 1997 [DE] Germany .............................. 197 06 789

[51] Int. Cl.$^7$ ............................................... H01L 21/8238
[52] U.S. Cl. ............................ 438/199; 438/221; 438/296
[58] Field of Search .................................. 438/199, 197, 438/218, 219, 221, 294, 295, 296

[56] References Cited

U.S. PATENT DOCUMENTS

| 4,916,508 | 4/1990 | Tsukamoto et al. . |
| 5,043,778 | 8/1991 | Teng et al. . |
| 5,132,755 | 7/1992 | Ueno . |

Primary Examiner—Tuan H. Nguyen
Attorney, Agent, or Firm—Herbert L. Lerner; Laurence A. Greenberg; Werner H. Stemer

[57] ABSTRACT

A CMOS circuit has all-around dielectrically insulated source-drain regions. Trenches are formed in the source-drain regions. The trenches are etched into the monocrystalline silicon and filled with undoped or very lightly doped silicon. The completely or nearly completely depleted silicon in the trenches represents a dielectrically insulating layer and insulates the source-drain regions towards the adjacent silicon substrate.

9 Claims, 1 Drawing Sheet

PROCESS FOR MANUFACTURING A CMOS CIRCUIT WITH ALL-AROUND DIELECTRICALLY INSULATED SOURCE-DRAIN REGIONS

BACKGROUND OF THE INVENTION

Field of the Invention

The invention pertains to integrated circuits and, more particularly, to a CMOS circuit with all-around dielectrically insulated source-drain regions and a process for manufacturing the CMOS circuit.

Circuits of that kind with all-around insulation of source-drain regions have the advantage that very small distances between n and p channels can be realized, in which parasitic pn junctions are largely prevented. Faster circuits can be obtained and flat source-drain doping profiles can be realized with a smaller film resistance.

Prior art circuits with all-around insulated source-drain regions can only be manufactured with substantial difficulty. Normally, so-called SOI techniques are employed (SOI= silicon on insulator), in which, for example, by using the so-called SIMOX process (separation by implantation of oxygen) or BESOI process (bonded etched-back silicon on insulator), a thin, monocrystalline silicon layer is produced on a trenched insulation layer, generally comprised of silicon dioxide. The production of the monocrystalline silicon layer, in which the channel regions of the MOS transistor are then produced, on the insulation layer is difficult, time-consuming, and costly.

SUMMARY OF THE INVENTION

It is accordingly an object of the invention to provide a CMOS circuit with all-around insulated source-drain regions, which overcomes the above-mentioned disadvantages of the heretofore-known devices and methods of this general type and which—based on a conventional wafer comprised of monocrystalline silicon—can be easily and inexpensively manufactured with conventional process steps.

With the foregoing and other objects in view there is provided, in accordance with the invention, a CMOS circuit assembly, comprising:
  a monocrystalline silicon body;
  all-around dielectrically insulated source-drain regions formed in said silicon body;
  the silicon body having trenches etched in the source-drain regions, the trenches being filled with undoped or only lightly doped silicon.

The CMOS circuit according to the invention differs from a circuit manufactured using SOI techniques primarily by the fact that the channel regions are a component of the wafer comprised of monocrystalline silicon. The insulation of the source-drain regions is based on the feature according to which trenches are produced in the source-drain regions and are filled with silicon. According to the invention, the trenches produced in an N or P channel resistor are filled with undoped or very low doped silicon. The material with these doping conditions may also be referred to as substantially undoped silicon. The silicon deposited in the trenches is therefore completely or nearly completely depleted and consequently represents a dielectrically insulating layer. The capacitance of the dielectrically insulating layer is determined essentially by its permittivity and thickness. On the other hand, the capacitance is largely independent of the voltage applied.

In principle, monocrystalline, polycrystalline, or amorphous silicon is suitable for filling the trenches in the source-drain regions. The trenches may, for example, be filled by means of conformal depositing of polycrystalline or amorphous silicon. In accordance with an additional feature of the invention, undoped silicon is used, which has been deposited in the trenches by means of selective epitaxy (so-called SEG). Trenches with a small trench diameter and a large aspect ratio are suitably filled by means of conformal depositing of polysilicon or amorphous silicon. Then, the deposited silicon is isotropically etched back to the trench surface, i.e. to the upper rim of the trench, or to slightly below the trench surface. The processes conventionally employed for etching silicon can be used here.

If in lieu of undoped silicon, very low doped silicon is used, this can in principle be doped using all of the compounds usually employed for doping silicon, for example, boron, phosphorus, or arsenic. The degree of doping is chosen so that the filled trench continues to have a sufficient insulating effect in comparison to the surrounding substrate. Accordingly, no specific numerical doping concentration need be provided here. Instead, those skilled in the art will readily know how to adjust the doping concentration so as to obtain sufficient resistivity of the silicon filler.

After the filling of the trenches etched into the source-drain regions, the silicon in the upper trench region is doped in a conventional manner. This produces the highly doped source and drain zones of the transistor. All materials normally employed for doping source-drain zones can be used. Phosphorus and arsenic are particularly suitable doping atoms for N channel transistors and primarily boron may be mentioned for P channel resistors.

In order to reduce the film resistance, a metal silicide layer can also be deposited on source and drain zones. Preferably, the metal silicide layer ends with the upper rim of the trench. The metal silicide layer may be a titanium silicide layer produced in a usual manner on the doped silicon in the upper trench region. So-called salicide processing is particularly suitable (salicide=self aligned silicide).

The size of the etched trenches that are filled with undoped or very lightly doped silicon depends on the embodiment of the respective MOS transistors to be dielectrically insulated. In a suitable embodiment, the trench cross section essentially corresponds to the area of the corresponding source or drain area in order to assure a complete insulation over this area. The depth of the trenches for conventional CMOS transistors generally lies in the range from approximately 0.3 to 1 mm and in particular between 0.5 and 0.7 mm.

With the above and other objects in view there is also provided, in accordance with the invention, a process for manufacturing a CMOS circuit assembly with all-around dielectrically insulated source-drain regions. The process comprises the following steps:
  anisotropically etching trenches in source-drain regions of a monocrystalline silicon body;
  filling the trenches with undoped or very lightly doped silicon;
  isotropically etching the silicon down to at least a rim of the trench; and
  doping the silicon in an upper trench region thereof.

In accordance with a preferred mode of the invention, these process steps are carried out after the structuring of the gate electrode and the production of the LDD (lightly doped drain) areas. The latter manufacturing steps can be carried out in the conventional manner.

Following the last of the above-noted four steps, a metal silicide layer may be produced in the source-drain regions, which adjoins the doped silicon in the upper trench region.

In accordance with again an additional feature of the invention, first the trench insulation is carried out for the lateral insulation of the individual transistors of the CMOS circuit. Known processes can be employed here, such as so-called shallow trench insulation, which uses silicon dioxide, for example, as the insulation material. After conventional formation of the gate oxide and the production of the gate electrode by depositing and structuring polysilicon in a conventional process, the flanks of the gate electrode are insulated in a conventional manner (manufacturing of the spacer). Then, the source and drain zones of the LDD transistors are produced by ion implantation by means of known process steps. This is followed by the above described four steps and, if desired, the depositing of a metal silicide layer onto the doped silicon in the trenches.

In the filling of the etched trenches with silicon (the filling step), attention must be paid that the process temperature is chosen so that in the already doped regions of the substrate, no diffusion of the doping atoms is triggered. The upper region of the silicon filler (the doping step) is doped at low energy and with short-term tempering at a low temperature.

The remaining process steps for manufacturing the finished CMOS circuit are then carried out in a manner which is known to those of skill in the art.

Other features which are considered as characteristic for the invention are set forth in the appended claims.

Although the invention is illustrated and described herein as embodied in a CMOS circuit with all-around dielectrically insulated source-drain regions and a process for manufacturing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
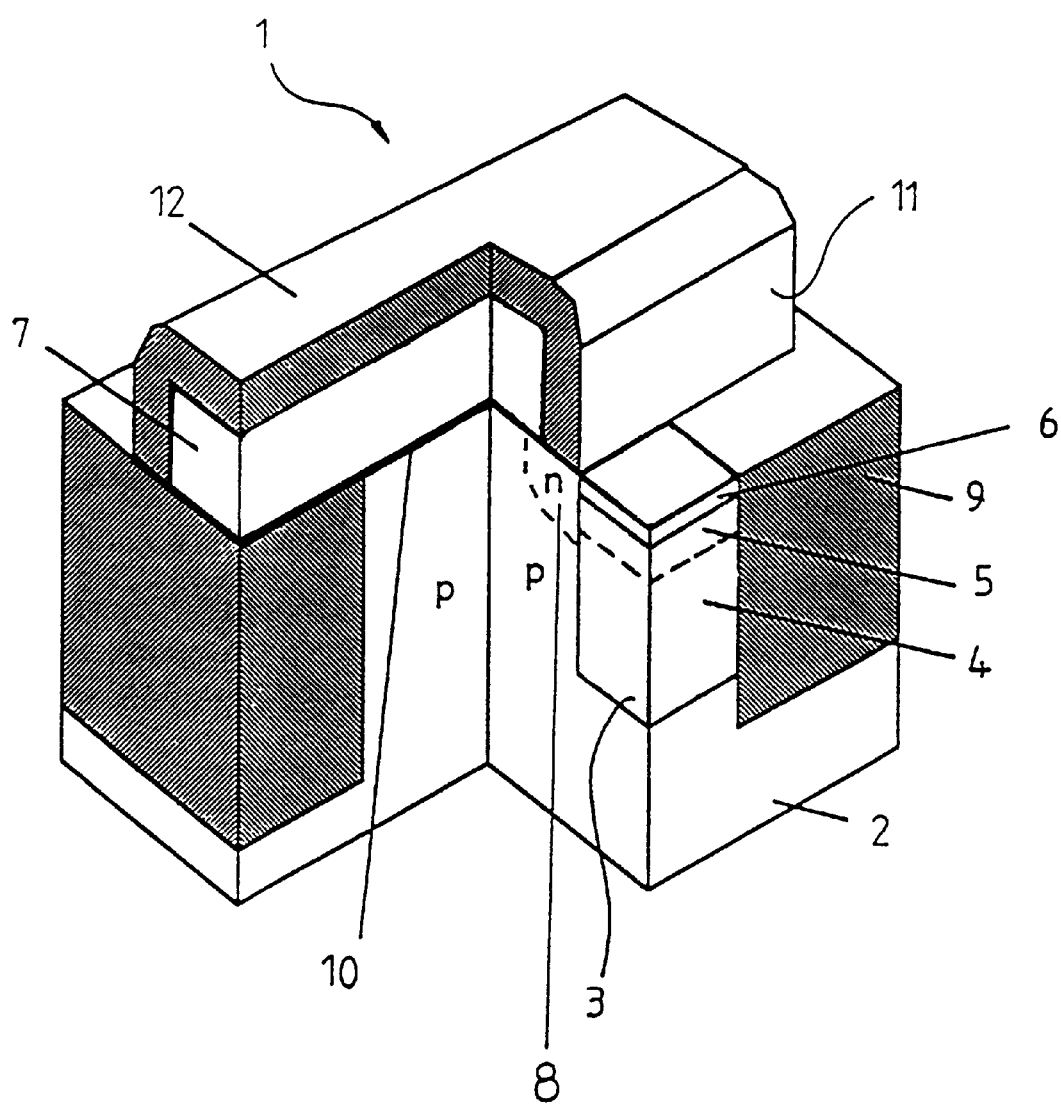
FIG. 1, the sole FIGURE of the drawing, is a schematic, partial sectional, perspective view of a CMOS circuit according to the invention, in the region of an N channel transistor after the production of the source-drain regions.

Referring now to the FIGURE of the drawing in detail, there is seen a detail of a CMOS circuit 1 in the region of an N channel transistor. It will be appreciated that the following description applies analogously for P channel transistors.

The N channel transistor region shown in FIG. 1 is laterally defined by insulating trenches (shallow trenches) 9 which have been produced by etching a p doped silicon wafer 2 and then filled with silicon dioxide. The trench depth, for example, is 0.7 mm. A gate electrode 7 formed of $n^+$ polysilicon is disposed on the p substrate 2 and is separated from the p substrate by means of the gate oxide 10. Flanks 11 and the top side of the gate electrode 7, i.e., the side distal from the p substrate 2, are covered with an insulation layer 12 of silicon dioxide. A drain area 8 is n doped into the region below the gate electrode 7. According to the invention, a trench 3 is etched into the drain area for its insulation. The trench has a depth, for example, of 0.6 mm. The trench 3 is filled with undoped silicon, which can be produced by means of selective epitaxy or the depositing of polysilicon and has then been etched back so that the surface of the silicon comes to be disposed slightly below the trench rim and the surface of the insulation trench 9. In the upper region 5, the silicon is highly n doped, for example, with arsenic. A titanium silicide layer 6 has been deposited on this highly doped silicone surface by means of salicide techniques.

Through the disposition shown, an N channel transistor can be obtained whose drain area represented here is dielectrically insulated all around. By virtue of the fact that the trench produced under the drain area is filled in its lower region with undoped or very low doped silicon, it insulates the drain area effectively in relation to the p substrate disposed below it. The shallow trench insulation is used for the lateral insulation of the individual transistors.

According to the invention, therefore, through the use of conventional substrates and processes, CMOS circuits can be obtained with all-around insulated source-drain regions. In relation to the known SOI techniques, the invention has the advantage of greater ease of manufacture of the circuits and prevents the floating of substrate regions of MOS transistors of the kind that occurs with the use of SOI techniques.

We claim:

1. A process for manufacturing a CMOS circuit assembly with all-around dielectrically insulated source-drain regions, which comprises the following steps:
   anisotropically etching trenches in source-drain regions of a monocrystalline silicon body;
   filling the trenches with at most lightly doped silicon;
   isotropically etching the silicon down to at least a rim of the trench; and
   doping the silicon in an upper trench region thereof thereby leaving the at most lightly doped silicon in a lower trench region thereof.

2. The process according to claim 1, wherein the isotropic etching step comprises etching the silicon to slightly below the rim of the trench.

3. The process according to claim 1, which comprises, prior to the anisotropic etching step, structuring a gate electrode and producing lightly doped drain regions in the silicon body.

4. The process according to claim 1, which comprises, subsequently to the doping step, depositing a metal silicide layer onto the doped silicon in the trench.

5. The process according to claim 1, which comprises the following sequential steps:
   laterally insulating the transistors by forming trench insulation;
   producing a gate oxide by gate oxidation;
   forming a gate electrode by depositing and structuring polysilicon;
   insulating flanks of the gate electrode;
   implanting ions and producing LDD regions; and
   subsequently performing the anisotropic etching step, the filling step, the isotropic etching step, and the doping step. optionally depositing a metal silicide layer onto the doped.

6. The process according to claim 5, which comprises subsequently to the doping step, depositing a metal silicide layer onto the doped silicon in the trenches.

7. The process according to claim 1, wherein the doping step comprises doping at relatively low energy and tempering for a brief time at a relatively low temperature.

8. The process according to claim 1, wherein the at most lightly doped silicon is undoped.

9. The process according to claim 1, wherein the at most lightly doped silicon is lightly doped.

* * * * *